United States Patent
Ito et al.

(10) Patent No.: US 7,808,551 B2
(45) Date of Patent: Oct. 5, 2010

(54) IMAGING MODULE AND METHOD OF MANUFACTURING IMAGING MODULE

(75) Inventors: Hiroshi Ito, Tokyo (JP); You Kondoh, Kanagawa (JP); Mikio Nakamura, Tokyo (JP)

(73) Assignee: Olympus Corporation, Tokyo (JP)

( * ) Notice: Subject to any disclaimer, the term of this patent is extended or adjusted under 35 U.S.C. 154(b) by 370 days.

(21) Appl. No.: 11/934,420

(22) Filed: Nov. 2, 2007

(65) Prior Publication Data

US 2008/0111907 A1    May 15, 2008

(30) Foreign Application Priority Data

Nov. 14, 2006   (JP)   ............... 2006-307636

(51) Int. Cl.
*H04N 5/225*   (2006.01)
(52) U.S. Cl. ................ 348/374; 348/340; 348/373
(58) Field of Classification Search ........... 348/76, 348/340, 373, 374, 375; 257/432, 133, 434, 257/678, 686, 696, 701, 702, 703, 730
See application file for complete search history.

(56) References Cited

U.S. PATENT DOCUMENTS

| 6,142,930 | A | * | 11/2000 | Ito et al. | ............ | 600/109 |
| 6,613,597 | B2 | * | 9/2003 | Stack | ............ | 438/27 |
| 2001/0055073 | A1 | * | 12/2001 | Shinomiya | ............ | 348/374 |
| 2004/0118595 | A1 | * | 6/2004 | Flammer et al. | ............ | 174/254 |
| 2004/0223072 | A1 | * | 11/2004 | Maeda et al. | ............ | 348/340 |
| 2005/0208702 | A1 | * | 9/2005 | Kim | ............ | 438/106 |

FOREIGN PATENT DOCUMENTS

JP   10-192236   7/1998

* cited by examiner

*Primary Examiner*—David L Ometz
*Assistant Examiner*—Peter Chon
(74) *Attorney, Agent, or Firm*—Scully, Scott, Murphy & Presser, P.C.

(57) ABSTRACT

An imaging module includes a flexible printed circuit board which has a first area on which a first functional element is mounted, a second area on which a second functional element is mounted, and a third area which is formed between the first area and the second area, an electronic component which is mounted on the first area, and an imaging device which is mounted on the second area. The flexible printed circuit board is formed by an insulating layer which is integrated, spreading over the first area, the second area, and the third area. The flexible printed circuit board is formed such that the flexible printed circuit board can be bent at least in the third area.

1 Claim, 7 Drawing Sheets

IMAGING MODULE AND METHOD OF MANUFACTURING IMAGING MODULE

CROSS-REFERENCE TO RELATED APPLICATION

The present application is based upon and claims the benefit of priority from the prior Japanese Patent Application No. 2006-307636 file on Nov. 14, 2006; the entire contents of which are incorporated herein by reference.

BACKGROUND OF THE INVENTION

1. Field of the Invention

The present invention relates to an imaging module, particularly a small size imaging module which is to be disposed at a front end portion of an electronic endoscope, and a method of manufacturing imaging module.

2. Description of the Related Art

In recent years, an endoscope for observing an inside of a body by inserting a long and slender inserting section into the body has been widely used. An electronic endoscope is an example of such endoscope. The electronic endoscope has a built-in imaging module which is provided with a solid state imaging device such as a charge coupled device (CCD) at a front-end hard portion.

The front-end hard portion is expected to be shortened, and have a thin diameter in order to ease patient's pain. Therefore, a size reduction of the solid state imaging device, and size reduction of the imaging module after the solid state imaging device is mounted becomes important. Regarding the size reduction of the imaging module, it is desired that an area of the imaging module viewed from the front side is not increased as far as possible, as compared to an area of the solid state imaging device.

Figure 7:
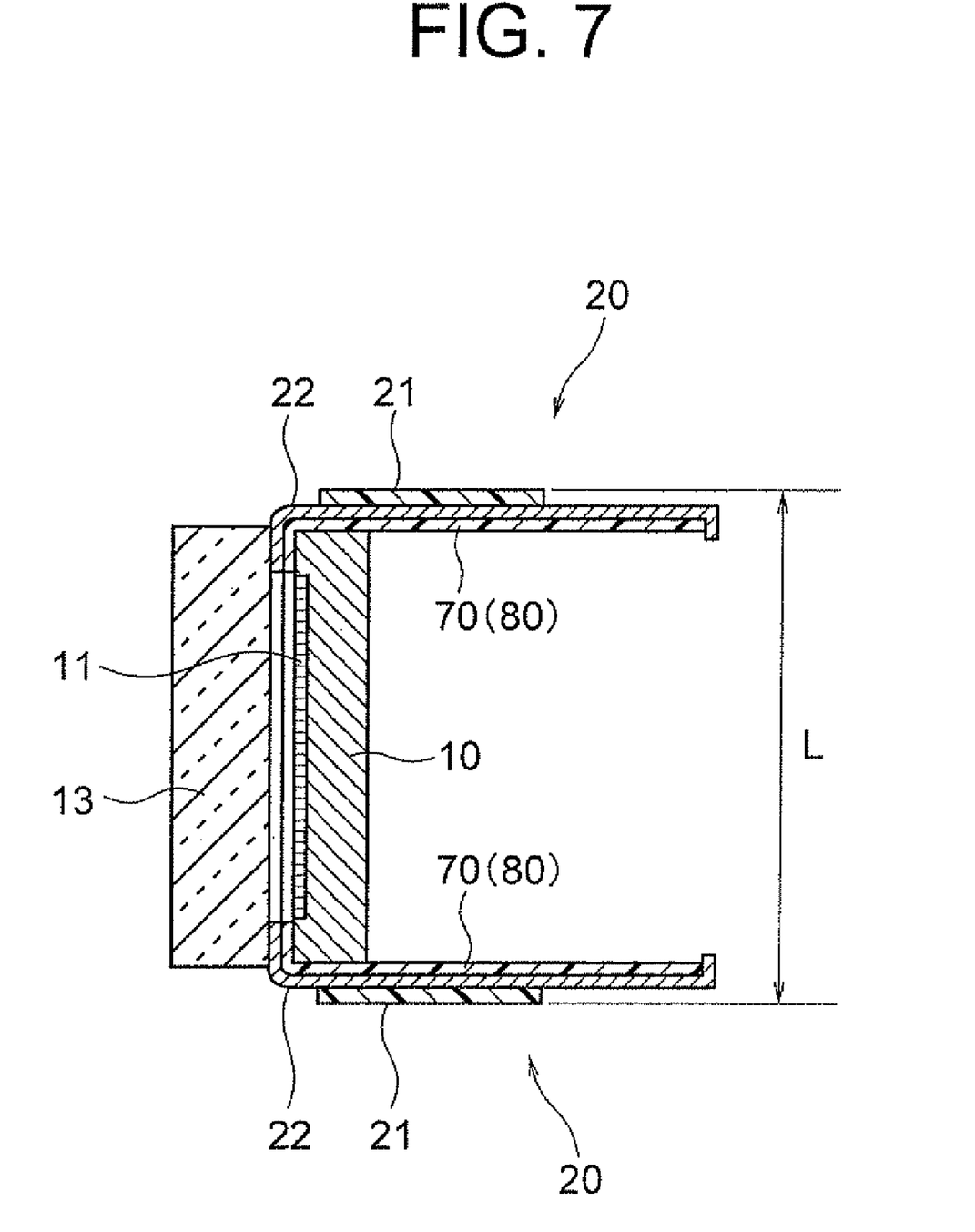
FIG. 7 is a diagram showing a schematic view of a conventional imaging module.

For example, in Japanese Patent Application Laid-open Publication No. Hei 10-192236, such electronic endoscope has been proposed. FIG. 7 shows a schematic structure of a front-end portion of the electronic endoscope in the Japanese Patent Application Laid-open Publication No. Hei 10-192236. Here, an inner lead 22 of a flexible substrate 20 is attached by bonding to a pad portion provided on a solid state imaging device 10 directed similarly as a light receiving surface 11. The inner lead 22 is arranged upon bending to face backward of the light receiving surface 11 along a side surface of the solid state imaging device 10. Moreover, an electrical insulating member 70 or an electrical insulating member 80 in a sheet form is applied to a surface of the inner lead 22, along the solid state imaging device 10, excluding a portion which is attached by bonding to the pad portion.

Accordingly, an electrical insulation between the side surface of the solid state imaging device 10 and the inner lead 22 is secured, and besides, an overall size of an assembly of a unit of the solid state imaging device 10 and the flexible substrate 20 is made small.

In a small size imaging unit which is to be disposed at the front end portion of an endoscope, it is desirable to reduce as much as possible a radius of curvature of a bent portion, and an amount of resin potting. However, in a structure according to the conventional technology, when the inner lead 22 is to be bent, from a point of view of securing mechanical strength and a point of view of securing insulation with the solid state imaging device, it is necessary to bend to a radius of curvature of certain magnitude. Moreover, practically, it is necessary to reinforce the mechanical strength of the bending portion of the inner lead 22 by potting the resin. In this manner, in the structure according to the conventional technology, it is difficult to secure high mechanical strength while maintaining a thin diameter.

SUMMARY OF THE INVENTION

The present invention is made to solve the above-mentioned problems, and an object of the present invention is to achieve an imaging module in which, a size reduction is realized such that the imaging module can be accommodated in a front-end portion of an electronic endoscope, as well as the mechanical strength of a metal line connecting portion to an imaging device is high.

To solve the abovementioned problems, and to achieve the object, according to the present invention, there is provided an imaging module including a flexible printed circuit board which includes a first area on which a first functional element is mounted, a second area on which a second functional element is mounted, and a third area which is formed between the first area and the second area, an electronic component which is mounted on the first area, and an imaging device which is mounted on the second area. The flexible printed circuit board is formed by an insulating layer which is integrated, spreading over the first area, the second area, and the third area. The flexible printed circuit board is formed such that the flexible printed circuit board can be bent at least in the third area.

Moreover, according to a preferable aspect of the present invention, it is desirable that the imaging device has a flip chip mounted at a position corresponding to a light transmitting portion which is formed in the second area, and further, that a cover glass is provided at a position corresponding to the light transmitting portion, on an opposite surface of the imaging device mounted side of the flexible printed circuit board, and that the flexible printed circuit board is bent in the third area, at a position corresponding to an end portion of the imaging device.

Moreover, according to a preferable aspect of the present invention, it is desirable that a structure which makes it easy to bend the flexible printed circuit board is provided in a bent portion of the third area of the flexible printed circuit board.

Furthermore, according to a preferable aspect of the present invention, it is desirable that the structure which makes it easy to bend the flexible printed circuit board is a stepped portion at which, a thickness of the flexible printed circuit board is thinner as compared to the surrounding of the bent portion.

According to a preferable aspect of the present invention, it is desirable that the flexible printed circuit board has a rectangular shape having at least a narrow side, and that the stepped portion is extended along a direction parallel to the narrow side of the flexible printed circuit board.

Moreover, according to another aspect of the present invention, there can be provided a method of manufacturing imaging module by using a semiconductor manufacturing process including an insulating layer formation step of forming an insulating layer integrally on a rigid substrate, a metal line formation step of forming a metal line on the insulating layer, a mounting step of mounting on a flexible printed circuit board, a predetermined functional element which includes an imaging device, a separation step of separating the flexible printed circuit board from the rigid substrate, and a bending step of bending the flexible printed circuit board.

According to a preferable aspect of the present invention, it is desirable that the rigid substrate is a light transmitting substrate, and that at the separation step, the light transmitting substrate is left in an area on an imaging surface of the imaging device.

BRIEF DESCRIPTION OF THE DRAWINGS

FIG. 5A to FIG. 3F are diagrams showing a process of manufacturing the imaging module according to the first embodiment;

DETAILED DESCRIPTION OF THE INVENTION

An imaging module and a method of manufacturing imaging module according to the present invention will be described below in detail by referring to the accompanying diagrams.

However, the present invention is not restricted to the embodiments described below.

First Embodiment

Figure 1:
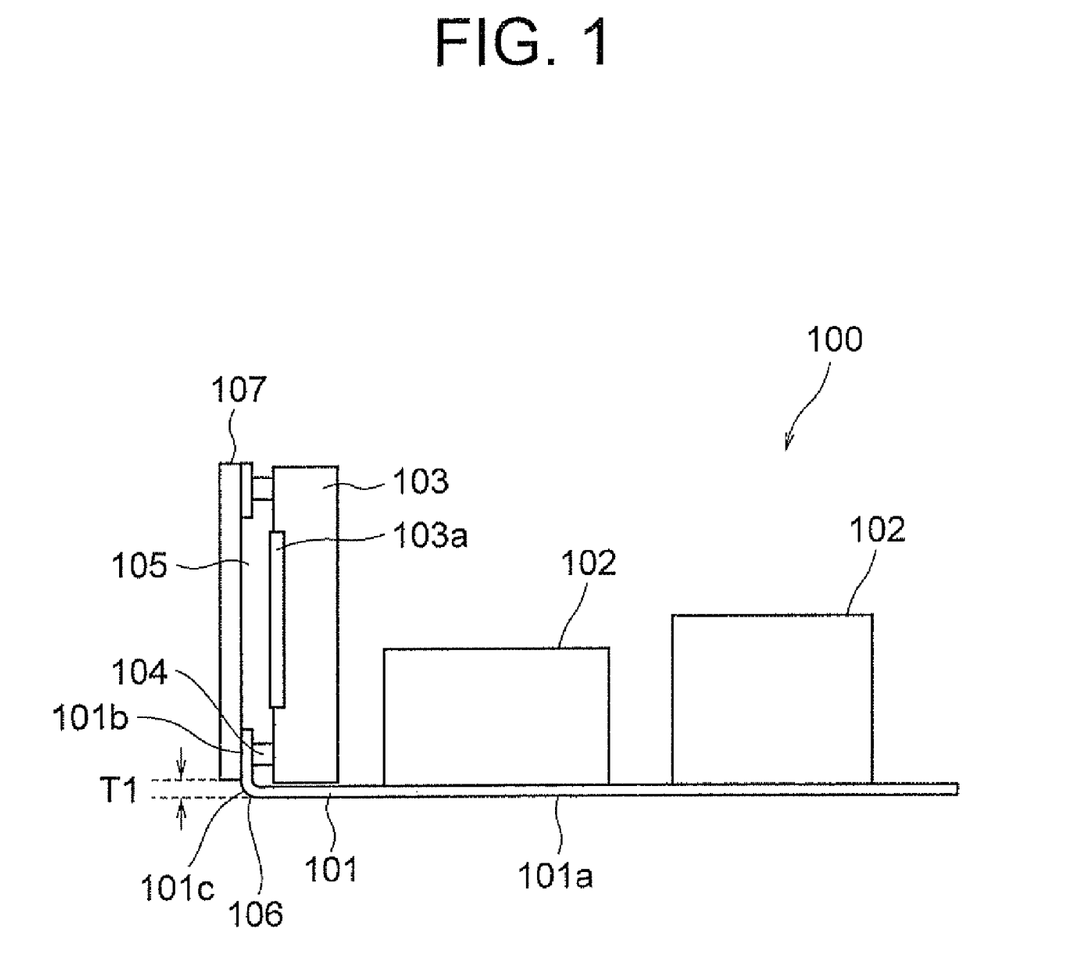
FIG. 1 is a diagram showing a cross-sectional structure of an imaging module according to a first embodiment of the present invention.

FIG. 1 is a diagram showing a schematic cross-sectional structure of an imaging module 100 of a first embodiment. A flexible printed circuit board 101 includes a first area 101a, a second area 101b, and a third area 101c. The third area 101c is formed between the first area 101a and the second area 101b.

An electronic component 102 is mounted on the first area 101a. An imaging device 103 is mounted on the second area 101b. The flexible printed circuit board 101 corresponds to a flexible substrate. The electronic component 102 corresponds to a first functional element. The imaging device 103 corresponds to a second functional element.

The imaging device 103 has a flip chip mounted at a position corresponding to a light transmitting portion 105 formed in the second area 101b. In this case, the imaging device 103 is mounted such that an imaging device light receiving section 103a and the light transmitting portion 105 coincide substantially.

The imaging device 103 is electrically connected to the flexible printed circuit board 101 by a metallic protrusion 104. The other electronic component 102 is also mounted on the flexible printed circuit board 101 by a method such as an SMT (Surface Mount Technology). Moreover, the flexible printed circuit board 101 is bent substantially perpendicularly, backward of the imaging device 103, by a bent portion 106, and the electronic component 102 is accommodated in a projected area of the imaging device 103. The bent portion 106 corresponds to a bent portion.

The flexible printed circuit board 101 is formed by an integrated insulating layer, spread over the first area 101a, the second area 101b, and the third area 101c. A structure of such flexible printed circuit board 101 will be described below with a method of manufacturing the imaging module 100.

Method of Manufacturing

Figure 2:
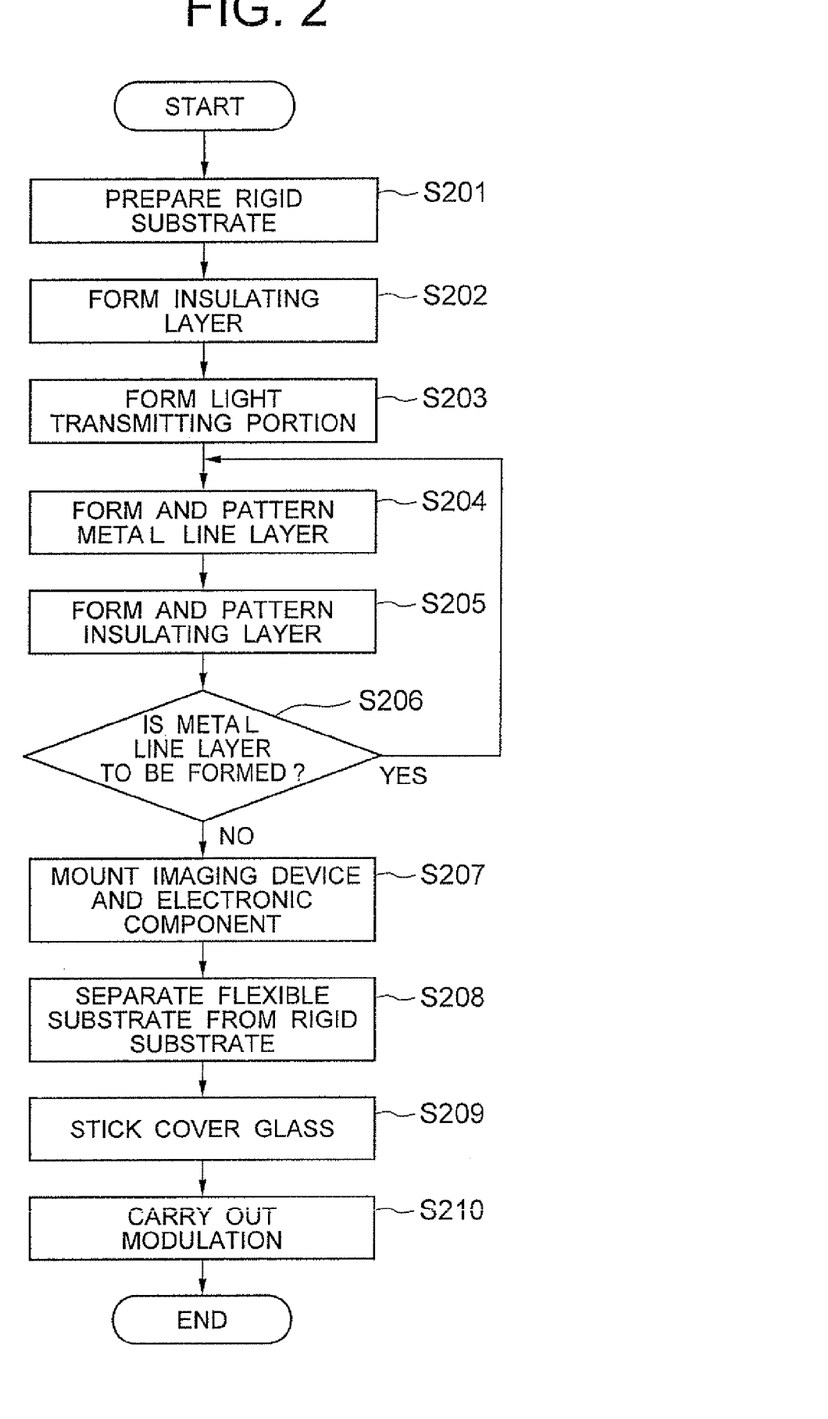
FIG. 2 is a flowchart showing a method of manufacturing the imaging module according to the first embodiment.

Next, a method of manufacturing the imaging module 100 will be described below. FIG. 2 is a flowchart showing a process of manufacturing the imaging module 100. Moreover, FIG. 3A to FIG. 3F are diagrams showing a process of manufacturing the imaging module 100. The imaging module 100 is manufactured by using a semiconductor microfabrication technology. The method of manufacturing the imaging module 100 will be described while referring to FIG. 2, and FIG. 3A to FIG. 3F.

Figure 3A:
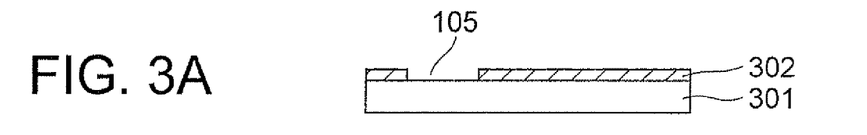

At step S201, a rigid substrate 301 is prepared. At an insulating layer formation step S202, an insulating layer 302 is formed integrally on the rigid substrate 301. At step S203, a light transmitting portion 105 is formed by selectively removing the insulating layer 302 of the portion which becomes the light transmitting portion 105, by a photolithography technology as shown in FIG. 3A.

At step S204, a metal line 303 is formed on the insulating layer 302, and patterning is carried out. At step S205, the insulating layer 302 is formed, and patterning is carried out. At step S206, a judgment of whether or not the metal line 303 is to be formed further is made. When a judgment result at step S206 is affirmative (Yes at step S206), the process returns to step S204. When the judgment result at step S206 is negative (No at step S206), the process advances to step S207.

Figure 3B:
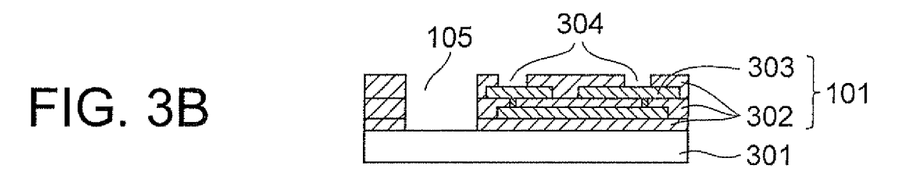

Steps S204, S205, and S206 correspond to a metal line formation step. By repeating steps S204 and S205 for a required number of times, a plurality of metal line layers 303 and a plurality of insulating layers 302 are stacked. FIG. 3B shows a state in which the plurality of metal line layers 303 and the plurality of insulating layers 302 are formed. Here, a land 304 is formed. Moreover, the flexible printed circuit board 101 is formed by the plurality of insulating layers 302 including the metal lines 303.

Figure 3C:
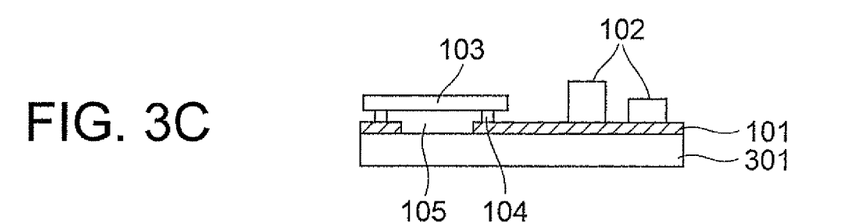

At a mounting step S207, predetermined functional elements including the imaging device 103 and the electronic component 102 are assembled on the flexible printed circuit board 101 as shown in FIG. 3C.

Figure 3D:
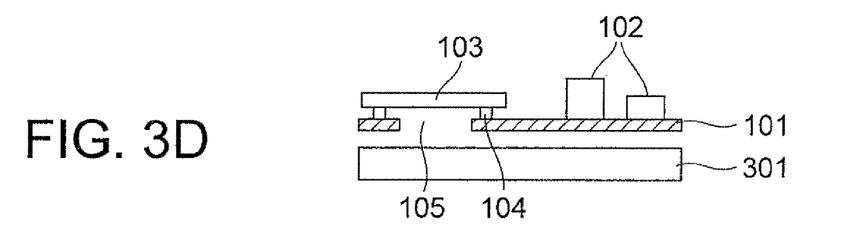
Figure 3E:
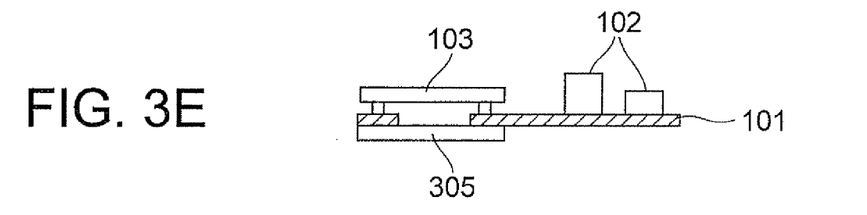

At a separation step S208, the flexible printed circuit board 101 is separated from the rigid substrate 301 as shown in FIG. 3D. At step S209, a cover glass 305 is adhered to an opposite surface of the imaging device 103 mounted side of the flexible printed circuit board 101, at a position corresponding to the light transmitting portion 105 as shown in FIG. 3E. It is possible to fix the imaging device 103 and the cover glass 305 to the flexible printed circuit board 101, securing an adhesion area. Therefore, it is possible to secure a mechanical strength.

Figure 3F:
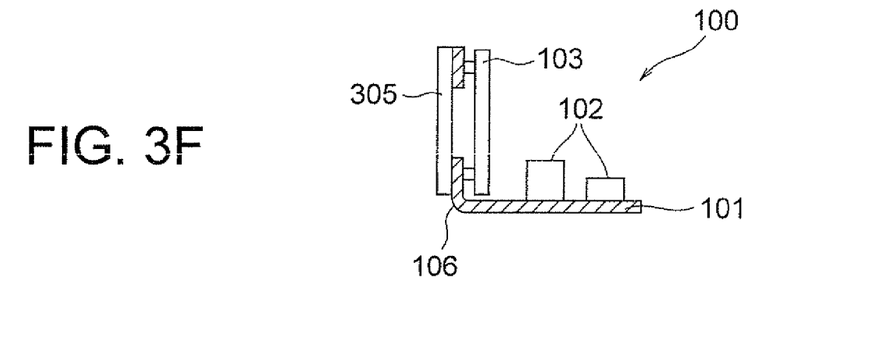

At a bending step S210, at the bent portion 106 in the third area, corresponding to an end portion of the imaging device 103, the flexible printed circuit board 101 is bent substantially perpendicularly, backward of the imaging device 103 as shown in FIG. 3F. Accordingly, it is possible to modulate the imaging device.

According to the present invention, the flexible printed circuit board 101 is formed by the integrated insulating layer 302 spread over the first area 101a, the second area 101b, and the third area 101c. In other words, the flexible printed circuit board 101 is formed by the insulating layer 302 including the metal line 303. Therefore, it is possible to bend easily the flexible printed circuit board 101, and the bending is possible with a small radius of curvature.

Moreover, the insulating layer 302 is formed integrally including the bent portion 106. Therefore, it is possible to secure a strength which is required when the flexible printed circuit board 101 is bent. Furthermore, the resin potting becomes unnecessary for reinforcing the strength. As a result, it is possible to reduce an amount of protrusion T1 (FIG. 1) from an end of the imaging device 103, as compared to a size of the protrusion in the conventional technology.

Furthermore, in the first embodiment, the metal line 303 is covered by the insulating layer 302. Therefore, it is possible to achieve a sufficient stability of an electrical connection. Moreover, since the structure of the imaging module 100 is simple, there is an advantage that the manufacturing is easy.

Moreover, in the first embodiment, the light transmitting portion 105 is formed removing the flexible printed circuit board 101 as shown in FIG. 3C, FIG. 3D, and FIG. 3E. However, when a material which forms the flexible printed circuit board 101 has sufficient light transparency, it may be let to be the light transmitting portion 105 leaving the flexible printed circuit board 101 as it is, without removing the flexible printed circuit board 101.

Second Embodiment

Next, an imaging module 200 according to a second embodiment of the present invention will be described below. Same reference numerals are assigned to components which are same as in the first embodiment, and description to be repeated is omitted.

Figure 4:
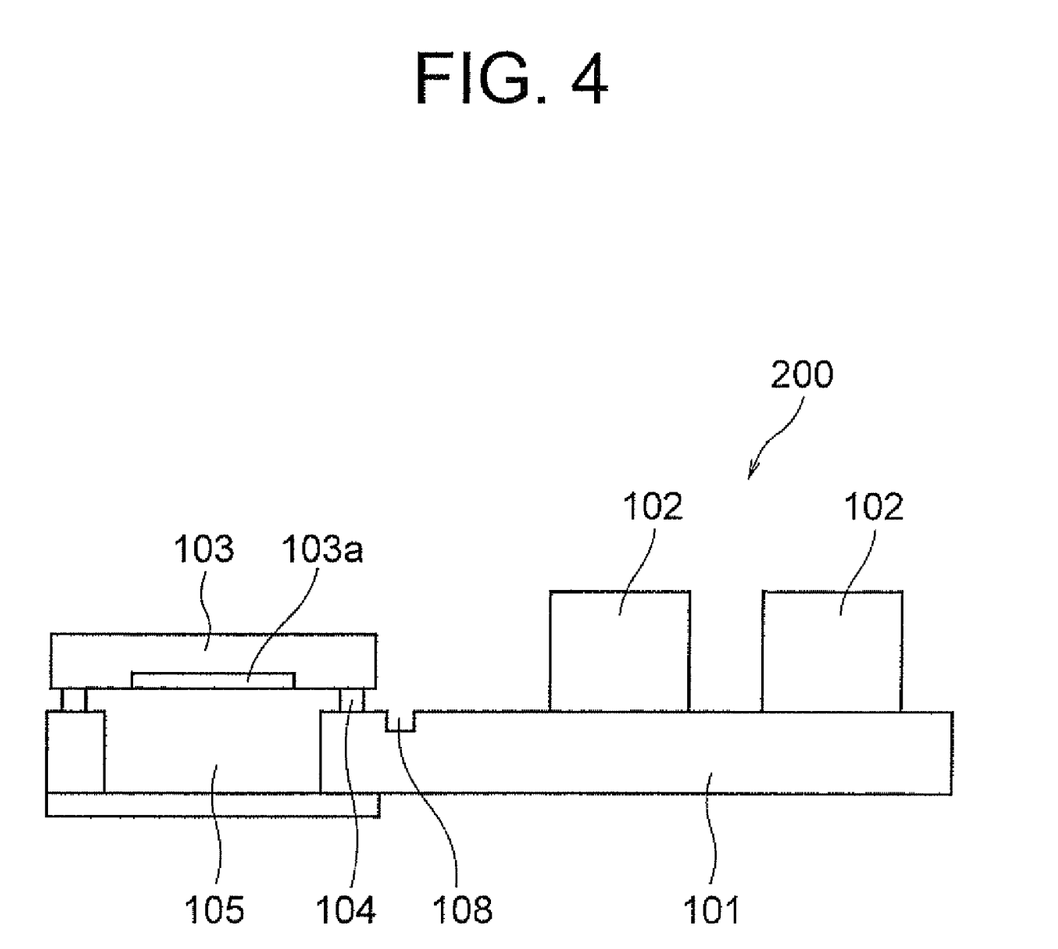
FIG. 4 is a diagram showing a cross-sectional structure of an imaging module according to a second embodiment of the present invention.
Figure 5:
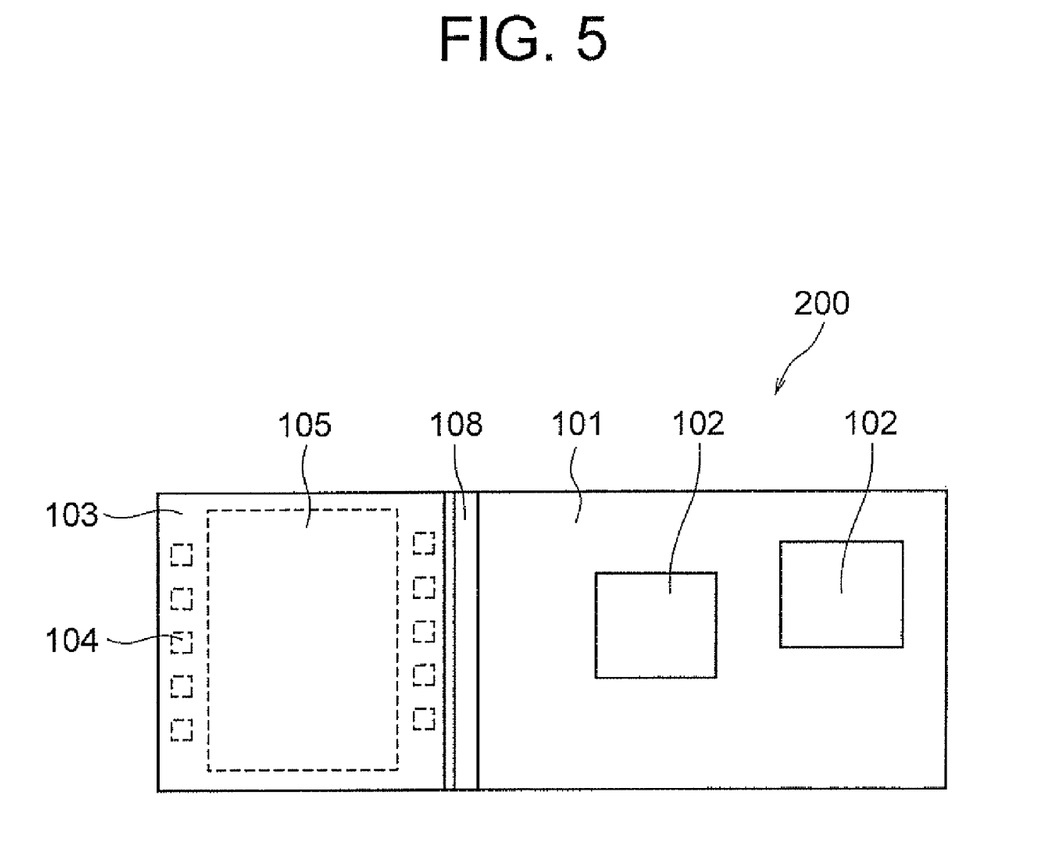
FIG. 5 is a diagram showing a top view of the imaging module according to the second embodiment.

FIG. 4 shows a cross-sectional structure of the imaging module 200 of the second embodiment. FIG. 5 shows a tow view of the imaging module 200. In the second embodiment, a stepping portion 108 is formed at a position of the bent portion of the flexible printed circuit board 101, in other words at a position of bending of the end of the imaging device 103. The stepping portion 108 is formed with an object of easing the bending of the flexible printed circuit board 101, and improving an accuracy of the bending position.

As shown in FIG. 5, the flexible printed circuit board 101 has a rectangular shape having at least a narrow side. Moreover, the stepping portion 108 is extended along a direction parallel to the narrow side of the flexible printed circuit board 101, intersecting the flexible printed circuit board 101. Moreover, at the stepping portion 108, a thickness of the flexible printed circuit board 101 is less as compared to the surrounding area.

At the time of manufacturing the flexible printed circuit board 101, it is possible to form the stepping portion 108 by using photolithography and etching in the semiconductor microfabrication. The stepping portion 108 eases accurate alignment at the time of bending the flexible printed circuit board 101.

Third Embodiment

Figure 6A:
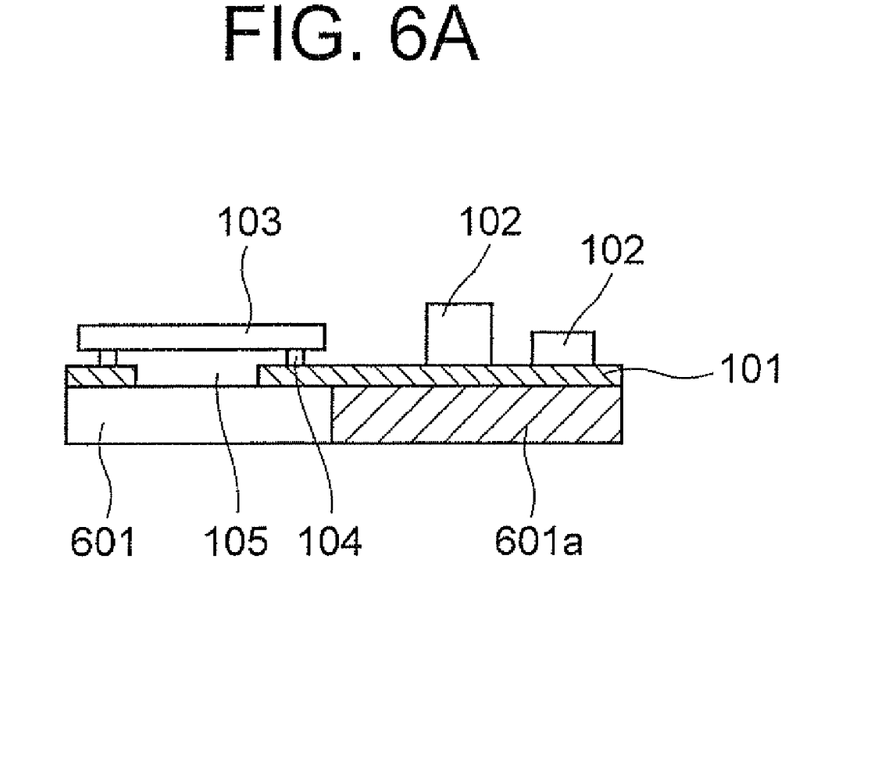
FIG. 6A and FIG. 6B are diagrams showing a method of manufacturing an imaging module according to a third embodiment of the present invention.
Figure 6B:
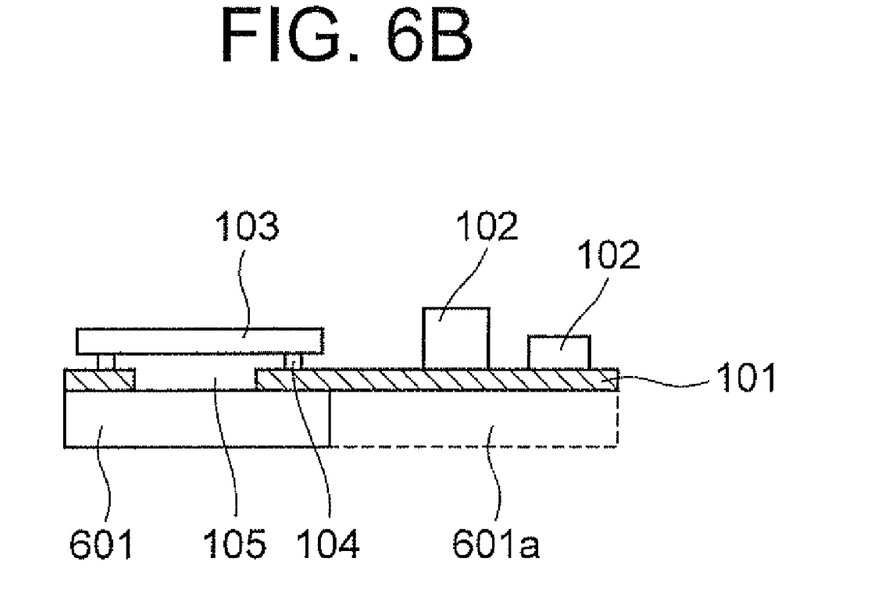

Next, a method of manufacturing imaging module according to a third embodiment of the present invention will be described below. Same reference numerals are used for components which are same as in the first embodiment and the second embodiment, and the description to be repeated is omitted. Moreover, in the third embodiment, a light transmitting substrate 601 is a rigid substrate unlike in the first embodiment, but the rest of the structure is same as in the first embodiment. FIG. 6A and FIG. 6B show a step of separating the flexible printed circuit board 101 from the light transmitting substrate 601. Steps other than the step shown in FIG. 6A and FIG. 6B, in other words, the steps in FIG. 3A to FIG. 3C, and FIG. 3F are same in the third embodiment. Therefore, the step which differs from the first embodiment will be described below.

FIG. 6A and FIG. 6B show a separation step in the third embodiment. As it has been described above, in the third embodiment, the light transmitting substrate 601 is used as the rigid substrate. Moreover, at the time of separating the flexible printed circuit board 101 from the light transmitting substrate 601, the light transmitting substrate 601 is left on the flexible printed circuit board 101 at a position corresponding to the light transmitting portion 105. In other words, at the separation step, it is desirable to leave the light transmitting substrate 601 in an area of an imaging surface of the imaging device 103.

As shown in FIG. 6A, an unnecessary portion 601a (a portion of the light transmitting substrate 601 shown by oblique lines) is removed selectively such that the light transmitting substrate is remained on the flexible printed circuit board 101, at the position corresponding to the light transmitting portion 105. Accordingly, it is possible to have a structure in which the light transmitting substrate 601 is formed only on the portion of the light transmitting portion 105 as shown in FIG. 6B.

The removal of the unnecessary portion 601a of the light transmitting substrate 601 is possible by removing the unnecessary portion 601a by the photolithography and etching, from a surface on an opposite side of a surface on which the flexible printed circuit board 101 is formed, or by dividing the light transmitting portion 105 and the unnecessary portion 601a by preparing a groove at a boundary of the light transmitting portion 105 and the unnecessary portion 601a, by etching, and then peeling off the unnecessary portion 601a from the flexible printed circuit board 601.

Thereafter, the flexible printed circuit board 101 is bent at the bent portion 106 similarly as in the first embodiment. In the third embodiment, it is possible to form the cover glass of the imaging device 103 by batch processing. Therefore, it is possible to shorten the time for manufacturing of the imaging module.

The present invention is not restricted to the embodiments described above, and various modifications which fairly fall within the basic teaching herein set forth are possible.

As it has been described above, the present invention is applicable to a small size imaging module, and particularly, to an imaging module in which a size reduction which allows accommodating the imaging module in a front-end portion of the electronic endoscope is possible.

According to the present invention, there is shown an effect that it is possible to achieve an imaging module in which, a size reduction is realized such that the imaging module can be accommodated in the front end portion of the electronic endoscope, as well as the mechanical strength of a metal line connecting portion to an imaging device is high.

What is claimed is:

1. A method of manufacturing imaging module by using a semiconductor manufacturing process, comprising:
   an insulating layer formation step of forming an insulating layer integrally on a rigid substrate;
   a metal line formation step of forming a metal line on the insulating layer;
   a mounting step of mounting on a flexible printed circuit board a predetermined functional element which includes an imaging device;
   a separation step of separating the flexible printed circuit board from the rigid substrate; and
   a bending step of bending the flexible printed circuit board;
   wherein the rigid substrate is a light transmitting substrate, and at the separation step, the light transmitting substrate is left in an area on an imaging surface of the imaging device.

* * * * *